(12) United States Patent
Lee et al.

(10) Patent No.: US 8,621,333 B2
(45) Date of Patent: Dec. 31, 2013

(54) ENCODING DEVICE, CONTROLLER AND SYSTEM INCLUDING THE SAME

(75) Inventors: Ki-Jun Lee, Seoul (KR); Jun-Jin Kong, Yongin-si (KR); Hong-Rak Son, Anyang-si (KR); Hyung-June Kim, Anyang-si (KR); Dong-Joon Shin, Seoul (KR); Sung-Han Jung, Gimhae-si (KR); Sung-Rae Kim, Jeonju-si (KR)

(73) Assignees: Samsung Electronics Co., Ltd., Suwon-si, Gyeonggi-do (KR); Industry-University Cooperation Foundation Hanyang University, Seongdong-gu, Seoul (KR); Soongsil University Research Consortium Techno-Park, Dongjak-gu, Seoul (KR)

( * ) Notice: Subject to any disclaimer, the term of this patent is extended or adjusted under 35 U.S.C. 154(b) by 369 days.

(21) Appl. No.: 13/012,304

(22) Filed: Jan. 24, 2011

(65) Prior Publication Data

US 2011/0185267 A1    Jul. 28, 2011

(30) Foreign Application Priority Data

Jan. 26, 2010    (KR) .................. 10-2010-0007108

(51) Int. Cl.
*H03M 13/00*    (2006.01)

(52) U.S. Cl.
USPC ........................................ 714/790

(58) Field of Classification Search
USPC .......................................... 714/746, 786, 790
See application file for complete search history.

(56) References Cited

U.S. PATENT DOCUMENTS

| | | | |
|---|---|---|---|
| 6,829,305 B2 | 12/2004 | Kang et al. | |
| 6,903,665 B2 | 6/2005 | Akhter et al. | |
| 7,178,092 B2 | 2/2007 | Akamatsu | |
| 7,778,197 B2 | 8/2010 | Kim | |
| 7,954,033 B2 * | 5/2011 | Hong et al. | 714/755 |
| 8,140,946 B2 * | 3/2012 | Eroz et al. | 714/786 |
| 2006/0190801 A1 * | 8/2006 | Shin et al. | 714/758 |

FOREIGN PATENT DOCUMENTS

| | | |
|---|---|---|
| JP | 2003-249040 A | 9/2003 |
| KR | 10 2001-0084834 A | 9/2001 |
| KR | 10 2007-0060446 A | 6/2007 |

OTHER PUBLICATIONS

Li et al., Optimal puncturing pattern design for rate compatible punctured Turbo codes, 2009, IEEE, p. 1 to 5.*
M. A. Kousa et al., Puncturing effects on Turbo codes, Juen 2002, IEEE, p. 132-138.*

* cited by examiner

*Primary Examiner* — Shelly A Chase
(74) *Attorney, Agent, or Firm* — Lee & Morse, P.C.

(57) ABSTRACT

An encoding device includes an encoder and a puncturing unit. The encoder generates parity bits based on information bits. The puncturing unit punctures the parity bits based on a puncturing pattern complying with a first criterion determining a period of the puncturing pattern and a second criterion determining positions of remaining parity bits.

20 Claims, 11 Drawing Sheets

FIG. 6E $$PP: \begin{bmatrix} 1 & 1 & 1 & 1 & 1 & 1 & 1 & 1 & 1 & 1 & 1 & 1 & 1 & 1 & 1 & 1 & 1 & 1 & 1 & 1 & 1 \\ 0 & 0 & 0 & 0 & 0 & 0 & 0 & 0 & 0 & 0 & 0 & 0 & 1 & 0 & 0 & 1 & 0 & 0 & 0 & 1 \end{bmatrix}$$ 409

```
        I21                                        I1    410
P21: 1 1 0 1 1 1 0 0 1 0 1 1 1 0 0 1 0 1 1 1 0
P17:         1 1 0 1 1 1 0 0 1 0 1 1 1 0 0 1 0
P13:                 1 1 0 1 1 1 0 0 1 0 1 1 1
```

ENCODING DEVICE, CONTROLLER AND SYSTEM INCLUDING THE SAME

BACKGROUND

1. Field

Exemplary embodiments relate to an encoding device, and more particularly to an encoding device that generates a code using a puncturing pattern, a controller and a system including the encoding device.

2. Description of the Related Art

An encoding device may generate parity bits by encoding information bits. The parity bits may be used to correct an error of the information bits. Such an encoding device may be employed in a communication system, a memory system, a data storage system, etc. For example, in the communication system, a transmitting device including the encoding device may transmit information bits to which parity bits are appended, and a receiving device may correct a transmission error of the information bits based on the parity bits.

SUMMARY

One or more embodiments may provide an encoding device that generates a code having a high code rate to efficiently correct an error.

One or more embodiments may provide a controller including an encoding device that generates a code having a high code rate to efficiently correct an error.

One or more embodiments may provide a system including an encoding device that generates a code having a high code rate to efficiently correct an error.

One or more embodiments may provide an encoding device configured to generate a code having a high code rate using a puncturing pattern complying with a first criterion and a second criterion.

One or more embodiments may provide an encoding device including an encoder and a puncturing unit. The encoder generates parity bits based on information bits. The puncturing unit punctures the parity bits based on a puncturing pattern complying with a first criterion determining a period of the puncturing pattern and a second criterion determining positions of remaining parity bits.

The first criterion may determine the period of the puncturing pattern such that each of the information bits participates in generating at least one of the remaining parity bits.

The second criterion may determine the positions of the remaining parity bits such that the remaining parity bits are separated from each other. The second criterion may determine the positions of the remaining parity bits such that the remaining parity bits are substantially uniformly distributed.

The period of the puncturing pattern may be determined by the following equation: $P = n*(k+1)$, where P represents the period of the puncturing pattern, k represents the maximum number of consecutive coefficients of a parity bit generator polynomial of the encoder having a value of 0, a mother code rate is 1/2, a target code rate is $n/(n+1)$, and n is an integer more than 1.

In a case where an equation $(n*k+n)/3 < p*k+k+1 \leq n*(k+1)$ is satisfied, the remaining parity bits may be separated from each other by $p+1$ bits, where p is a period of a parity bit generator polynomial of the encoder.

In a case where an equation $p*k+k+1 < (n*k+n)/A$ is satisfied, the remaining parity bits may be separated from each other by $A*p+1$ bits, where p is a period of a parity bit generator polynomial of the encoder, and A is an integer more than 2.

In a case where an equation $p*k+k+1 < (n*k+n)/A$ is satisfied, a location of an i-th remaining parity bit may be determined by an equation $(i'-1)*p+i$, where p is a period of a parity bit generator polynomial of the encoder, A is an integer more than 2, and i' is determined by performing an i' determination operation $i-1$ times. The i' determination operation resets i' to 1 when an equation $p*i'+i+1 > n*k+n$ is satisfied, and increases i' by 1 when the equation $p*i'+i+1 > n*k+n$ is not satisfied.

The puncturing unit may include a puncturing pattern table configured to store the puncturing pattern, and a puncturer configured to puncture the parity bits based on the puncturing pattern stored in the puncturing pattern table.

The encoder may include a recursive systematic convolutional encoder.

The recursive systematic convolutional encoder may include a memory unit configured to temporarily store feedback bits, a first operation unit configured to perform a first operation on at least one first bit of the feedback bits stored in the memory unit and a currently input information bit of the information bits, and configured to provide the result of the first operation as the feedback bits to the memory unit, and a second operation unit configured to perform a second operation on at least one second bit of the feedback bits stored in the memory unit and the result of the first operation, and configured to output the result of the second operation as the parity bits.

The memory unit may include a plurality of flip-flops connected in series. The plurality of flip-flops may sequentially receive the feedback bits, and may perform a shift operation on the sequentially received feedback bits.

The first operation unit may include an XOR unit configured to perform an XOR operation on the first bit and the currently input information bit.

The second operation unit may include an XOR unit configured to perform an XOR operation on the second bit and the result of the first operation.

A mother code rate of the recursive systematic convolutional encoder may be 1/2 or 2/3.

One or more embodiments may provide a controller including an encoding device and a decoding device. The encoding device generates parity bits based on information bits provided from a host device, punctures the parity bits based on a puncturing pattern complying with a first criterion determining a period of the puncturing pattern and a second criterion determining positions of remaining parity bits, and provides the information bits and the remaining parity bits to at least one storage device. The decoding device corrects an error of the information bits by decoding the information bits and the remaining parity bits received from the at least one storage device.

The controller may further include a puncturing pattern table configured to store the puncturing pattern.

The controller may further include a host interface configured to interface with the host device, and a client interface configured to interface with the at least one storage device.

One or more embodiments may provide a system including a host device, a controller and a storage device. The host device generates information bits. The controller receives the information bits from the host device, generates parity bits based on the information bits, and generates a code including the information bits and remaining parity bits by puncturing the parity bits based on a puncturing pattern complying with a first criterion determining a period of the puncturing pattern and a second criterion determining positions of the remaining parity bits. The storage device stores the code including the information bits and the remaining parity bits.

The storage device may include a flash memory device.

BRIEF DESCRIPTION OF THE DRAWINGS

Features will become more apparent to those of ordinary skill in the art by describing in detail exemplary embodiments with reference to the attached drawings, in which:

FIGS. 6A through 6E illustrate diagrams of exemplary puncturing patterns and remaining parity bits;

DETAILED DESCRIPTION

Figure 1:
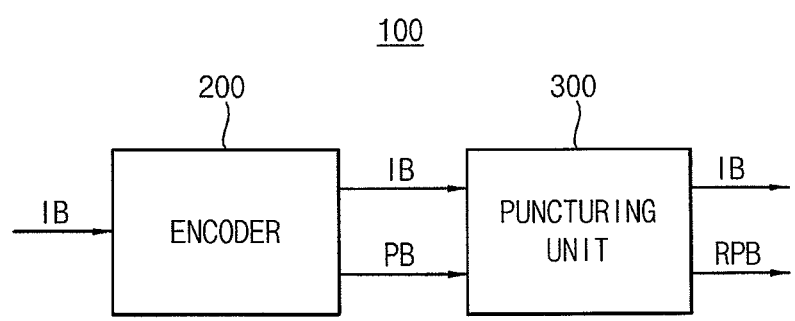
FIG. 1 illustrates a block diagram of an exemplary embodiment of an encoding device.

Korean Patent Application No. 10-2010-0007108, filed on Jan. 26, 2010, in the Korean Intellectual Property Office, and entitled: "Encoding Device, Controller and System Including the Same," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the specification.

It will be understood that, although the term's first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items. It will be understood that when an element is referred to as being "connected" or "coupled" to another element, it can be directly connected or coupled to the other element or intervening elements may be present.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of an exemplary embodiment of an encoding device 100. Referring to FIG. 1, the encoding device 100 may include an encoder 200 and a puncturing unit 300. FIGS. 2A, 2B, 2C, and 2D illustrate diagrams of exemplary puncturing patterns employable by the encoding device 100 of FIG. 1.

The encoder 200 may generate parity bits PB based on information bits IB. The encoder 200 may include a recursive systematic convolutional (RSC) encoder. The RSC encoder may store the information bits IB and receive the stored information bits IB as feedback. Thus, a currently generated parity bit may be affected by previously input information bits IB as well as a currently input information bit IB. Accordingly, decoding and error correction may be accurately achieved even though a code rate may be increased by puncturing the parity bits PB. For example, the RSC encoder may have a mother code rate of 1/2, 2/3, etc., and an output code may have a code rate higher than the mother code rate since the parity bits PB may be punctured by the puncturing unit 300. The encoder 200 may provide the information bits IB and the parity bits PB to the puncturing unit 300.

The puncturing unit 300 may perform a puncturing operation that removes a portion of the parity bits PB based on a puncturing pattern. The puncturing pattern may comply with one or more criterions, e.g., a first criterion determining a period of the puncturing pattern and a second criterion determining positions of remaining parity bits RPB. The remaining parity bits RPB are the parity bits PB that are not removed by the puncturing operation.

The first criterion may determine the period of the puncturing pattern such that every information bit IB may participate in generating the remaining parity bits RPB. That is, each information bit IB may participate in generating at least one of the remaining parity bits RPB when the parity bits PB are punctured based on the puncturing pattern satisfying the first criterion. In some embodiments, the second criterion may determine the positions of the remaining parity bits such that the remaining parity bits RPB are separated from each other. In other embodiments, the second criterion may determine the positions of the remaining parity bits such that the remaining parity bits RPB are uniformly and/or substantially uniformly distributed, which may improve efficiency of error correction.

For example, in a case where the mother code rate of the encoder 200 is 1/2 and a target code rate is $n/(n+1)$, the period of the puncturing pattern may be determined by an equation, "$P=n*(k+1)$" so that the period of the puncturing pattern may comply with the first criterion. Here, P represents the period of the puncturing pattern, k represents the maximum number of consecutive coefficients of a parity bit generator polynomial of the encoder 200 having a value of 0, and n is an integer more than 1.

Figure 2A:
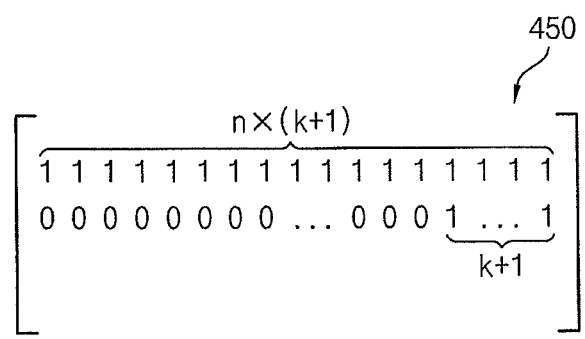
FIGS. 2A, 2B, 2C, and 2D illustrate diagrams of exemplary puncturing patterns employable in the encoding device of FIG. 1.

Referring to FIG. 2A, a puncturing pattern 450 has a period of $n*(k+1)$ bits. The first row of the puncturing pattern 450 represents whether the information bits remain or not, and the second row of the puncturing pattern 450 represents whether the parity bits remain or not. In the example illustrated in FIG. 2A, where the puncturing pattern 450 has the period of $n*(k+$ 1) bits, and k+1 parity bits located at the right side are not punctured, every information bit participates in generating at least one of the k+1 remaining parity bits. That is, the puncturing pattern 450 complies with the first criterion. However, since the remaining parity bits are not substantially uniformly distributed, the encoding device 100 of FIG. 1 may not employ the puncturing pattern 450.

To obtain a puncturing pattern complying with the second criterion, the locations of the remaining parity bits may be divided into three cases, and may be determined as described below with reference to FIGS. 2B through 2D.

Figure 2B:
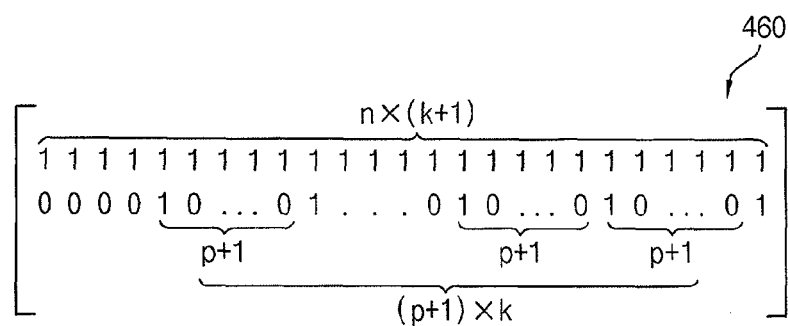

Referring to FIG. 2B, in a case where an equation, "(n*k+n)/3<p*k+k+1<=n*(k+1)" is satisfied, the remaining parity bits may be separated from each other by p+1 bits. Here, p represents a period of the parity bit generator polynomial of the encoder 200. The puncturing pattern 460 illustrated in FIG. 2B may be obtained by adjusting the locations of the remaining parity bits of the puncturing pattern 450 illustrated in FIG. 2A. That is, an i-th remaining parity bit of the puncturing pattern 450 may be substituted with an ((i−1)*p+i)-th parity bit of the puncturing pattern 460. Here, i is an integer from 1 to k+1, and the parity bits are counted from the right side.

For example, the first remaining parity bit of the puncturing pattern 450 may be substituted with a ((1−1)*p+1)-th parity bit, or the rightmost parity bit of the puncturing pattern 460. That is, the location of the first remaining parity bit does not change. The second remaining parity bit of the puncturing pattern 450 may be substituted with a ((2−1)*p+2)-th parity bit, or a (p+2)-th parity bit of the puncturing pattern 460. Similarly, the (k+1)-th remaining parity bit of the puncturing pattern 450 may be substituted with a ((k+1−1)*p+k+1)-th parity bit, or a (k*p+k+1)-th parity bit of the puncturing pattern 460.

Since the puncturing pattern 460 is obtained from the puncturing pattern 450 complying with the first criterion by adjusting the locations of the remaining parity bits based on the period p of the parity bit generator polynomial of the encoder 200, the puncturing pattern 460 also complies with the first criterion. Further, since the remaining parity bits of the puncturing pattern 460 are separated from each other by p+1 bits and are substantially uniformly distributed, the puncturing pattern 460 complies with the second criterion.

Figure 2C:
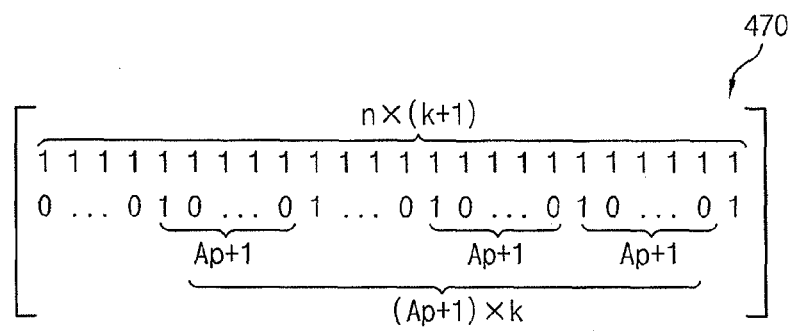

Referring to FIG. 2C, in a case where an equation, "p*k+k+1<=(n*k+n)/A" is satisfied, and A is an integer more than 2, the remaining parity bits may be separated from each other by A*p+1 bits. The puncturing pattern 470 illustrated in FIG. 2C may be obtained by adjusting the locations of the remaining parity bits of the puncturing pattern 450 illustrated in FIG. 2A. That is, an i-th remaining parity bit of the puncturing pattern 450 may be substituted with an ((i−1)*A*p+i)-th parity bit of the puncturing pattern 470.

For example, the first remaining parity bit of the puncturing pattern 450 may be substituted with a ((1−1)*A*p+1)-th parity bit, or the rightmost parity bit of the puncturing pattern 470. That is, the location of the first remaining parity bit does not change. The second remaining parity bit of the puncturing pattern 450 may be substituted with a ((2−1)*A*p+2)-th parity bit, or a (A*p+2)-th parity bit of the puncturing pattern 470. Similarly, the (k+1)-th remaining parity bit of the puncturing pattern 450 may be substituted with a ((k+1−1)*A*p+k+1)-th parity bit, or a (k*A*p+k+1)-th parity bit of the puncturing pattern 470.

Since the puncturing pattern 470 is obtained from the puncturing pattern 450 complying with the first criterion by adjusting the locations of the remaining parity bits based on the period p of the parity bit generator polynomial of the encoder 200, the puncturing pattern 470 also complies with the first criterion. Further, since the remaining parity bits of the puncturing pattern 470 are separated from each other by A*p+1 bits and are substantially uniformly distributed, the puncturing pattern 470 complies with the second criterion.

Figure 2D:
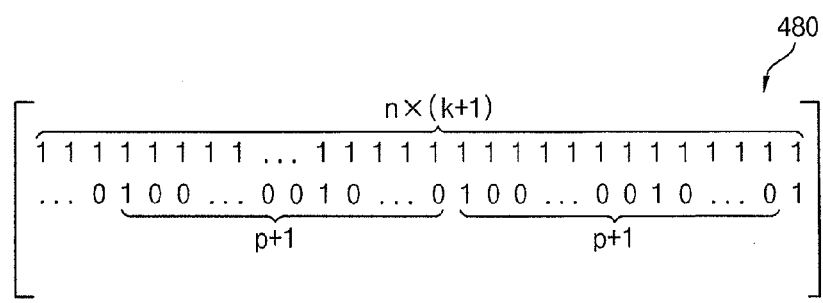

Referring to FIG. 2D, in a case where an equation, "p*k+k+1>n*k+n" is satisfied, an i-th remaining parity bit of the puncturing pattern 450 may be substituted with an ((i'−1)*p+i)-th parity bit of the puncturing pattern 480. For example, if i is 3, the third remaining parity bit of the puncturing pattern 450 may be substituted with ((i'−1)*p+3)-th parity bit of the puncturing pattern 480. Here, i' is initially set to 1, and is determined by performing an i' determination operation i−1 times. The i' determination operation resets i' to 1 if an equation, "p*i'+i+1>n*k+n" is satisfied, and increases i' by 1 unless the equation, "p*i'+i+1>n*k+n" is satisfied.

For example, if it is supposed that p is 7, n is 4, and k is 3, the number of the remaining parity bits is (k+1), or 4. When i is 1, the i' determination operation is not performed, and i' has an initial value, 1. Accordingly, the location of the first remaining parity bit becomes ((1−1)*7+1)=1. That is, the first remaining parity bit is located at the rightmost position. When i is 2, the i' determination operation is performed one time. Since the equation, "p*i'+i+1>n*k+n" is not satisfied, i' is increased from the initial value to 2. Accordingly, the location of the second remaining parity bit becomes ((2−1)*7+2)=9, and the second remaining parity bit is located at the 9th position from the rightmost position. When i is 3, the i' determination operation is performed two times. In the first i' determination operation, the equation, "p*i'+i+1>n*k+n" is not satisfied, and i' becomes 2. In the second i' determination operation, the equation, "p*i'+i+1>n*k+n" is satisfied, and i' is reset to the initial value, 1. Accordingly, the location of the third remaining parity bit becomes ((1−1)*7+3)=3, and the third remaining parity bit is located at the 3rd position from the rightmost position. Similarly, the location of the fourth remaining parity bit becomes ((2−1)*7+4)=11, and the third remaining parity bit is located at the 11th position from the rightmost position.

The puncturing pattern 480 where the locations of the remaining parity bits are determined by the method described above complies with the first criterion and the second criterion.

Referring again to FIG. 1, the puncturing unit 300 may output the information bits IB and the remaining parity bits RPB as an output code of the encoding device 100. Since the encoding device 100 outputs the code having the information bits IB and the remaining parity bits RPB, the output code of the encoding device 100 has a code rate higher than a code having the information bits IB and the parity bits PB. Further, since every information bit IB participates in generating at least one remaining parity bit RPB, an accurate error correction may be achieved by the output code of the encoding device 100.

Figure 3:
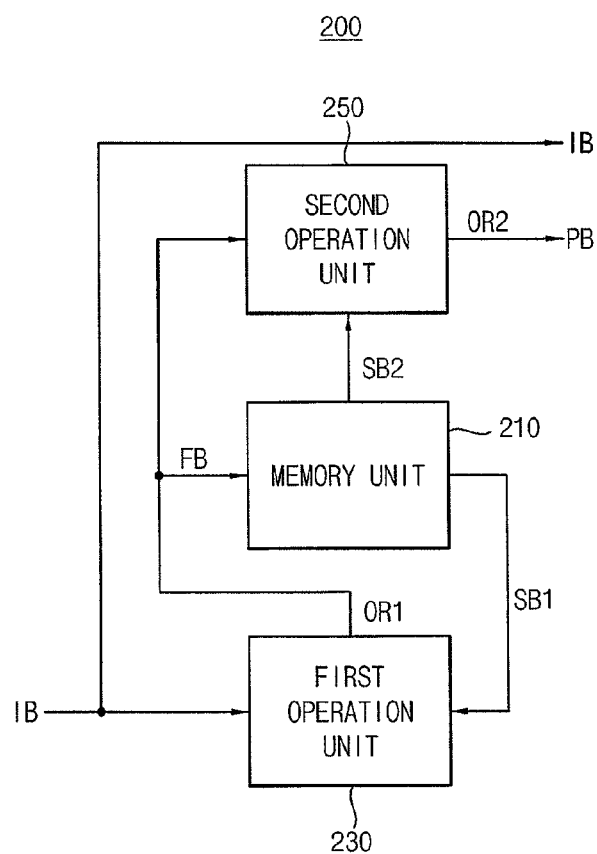
FIG. 3 illustrates a block diagram of an exemplary embodiment of an encoder employable in the encoding device of FIG. 1.

FIG. 3 illustrates a block diagram of an exemplary embodiment of the encoder 200 employable in the encoding device 100 of FIG. 1.

Referring to FIG. 3, the encoder 200 may include a memory unit 210, a first operation unit 230, and a second operation unit 250.

The memory unit 210 may temporarily store feedback bits FB. The memory unit 210 may include at least one memory element. A memory order of the memory unit 210 may be one or more. In some embodiments, the memory unit 210 may include a shift register that sequentially receives the feedback bits FB and performs a shift operation on the sequentially-received feedback bits FB. The shift register may include serial-connected flip-flops.

The first operation unit 230 may receive information bits IB and at least one first bit SB1 of the feedback bits FB stored in the memory unit 210. The first operation unit 230 may perform a first operation on the first bit SB1 and a currently input information bit of the information bits IB. The first operation unit 230 may provide a result OR1 of the first operation to the memory unit 210 as a current feedback bit of the feedback bits FB. For example, the first operation unit 230 may generate the current feedback bit by performing an XOR operation on the first bit SB1 and the currently input information bit.

The second operation unit 250 may receive the result OR1 of the first operation from the first operation unit 230 and at least one second bit SB2 of the feedback bits FB stored in the memory unit 210. The second operation unit 250 may perform a second operation on the second bit SB2 and the result OR1 of the first operation. The second operation unit 250 may output a result OR2 of the second operation as a current parity bit of parity bits PB. For example, the second operation unit 250 may generate the current parity bit by performing an XOR operation on the second bit SB2 and the result OR1 of the first operation.

FIGS. 4A, 4B, 4C, 4D, 4E, 4F, and 4G illustrate schematic diagrams of exemplary embodiments of the encoder 200 of FIG. 3.

Figure 4A:
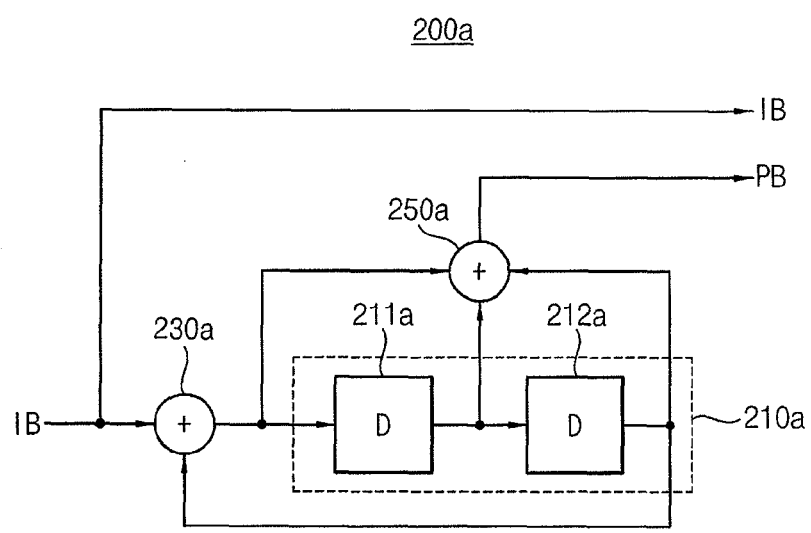
FIGS. 4A, 4B, 4C, 4D, 4E, 4F, and 4G illustrate schematic diagrams of exemplary embodiments of the encoder of FIG. 3.

Referring to FIG. 4A, an RSC encoder 200a may have a memory order of 2 and a generator polynomial, G=[1, 7/5]. The encoder 200a may include a memory unit 210a, a first operation unit 230a and a second operation unit 250a.

The memory unit 210a may include a first memory element 211a and a second memory element 212a. The first memory element 211a may receive a result of a first operation as a feedback bit from the first operation unit 230a. The first memory element 211a may temporarily store the feedback bit output from the first operation unit 230a. An output terminal of the first memory element 211a may be coupled to an input terminal of the second memory element 212a. The second memory element 212a may temporarily store an output bit of the first memory element 211a. Accordingly, the feedback bit input to the memory unit 210a may be output from the first memory element 211a after 1 unit of time (e.g., 1 clock), and may be output from the second memory element 212a after 2 units of time (e.g., 2 clocks).

In some embodiments, the first memory element 211a and the second memory element 212a may be implemented with delay elements. In other embodiments, the first memory element 211a and the second memory element 212a may be implemented with registers, such as flip-flops. In such cases, the memory unit 210a may be implemented with a shift register including serial-connected flip-flops.

The first operation unit 230a may receive information bits IB and a bit stored in the second memory element 212a. The first operation unit 230a may perform a first operation on a currently input information bit IB and an output bit of the second memory element 212a. For example, the first operation unit 230a may include an XOR gate that performs an XOR operation on the currently input information bit IB and the output bit of the second memory element 212a.

The second operation unit 250a may receive an output bit of the first operation unit 230a, a bit stored in the first memory element 211a and the bit stored in the second memory element 212a. The second operation unit 250a may perform a second operation on the output bit of the first operation unit 230a, the output bit of the first memory element 211a and the output bit of the second memory element 212a. For example, the second operation unit 250a may include an XOR gate that performs an XOR operation on the output bit of the first operation unit 230a, the output bit of the first memory element 211a and the output bit of the second memory element 212a.

The encoder 200a has the generator polynomial represented as G=[1, 7/5], which indicates that the encoder 200a is a recursive systematic convolutional encoder, that the parity bit PB output from the second operation unit 250a is generated based on the information bit IB, the output bit of the first memory element 211a and the output bit of the second memory element 212a, and that the feedback bit output from the first operation unit 230a is generated based on the information bit IB and the output bit of the second memory element 212a. Here, the generator polynomial is represented in octal.

The encoder 200a has a parity-bit generator polynomial, which is an infinite series as follows: $P(D)=1+D+D^3+D^5+D^7\ldots$.

Here, the first term '1' represents that a currently input information bit IB affects a current parity bit PB, the second term 'D' represents that an information bit IB that is previously input 1 unit of time (e.g., 1 clock) ago affects the current parity bit PB, the third term '$D^3$' represents that an information bit IB that is previously input 3 units of time (e.g., 3 clocks) ago affects the current parity bit PB, and the fourth term '$D^5$' represents that an information bit IB that is previously input 5 units of time (e.g., 5 clocks) ago affects the current parity bit PB. That is, the current parity bit PB may be affected by the currently input information bit IB and the previously-input information bits IB. Accordingly, even though the encoding device 100 illustrated in FIG. 1 may output a code having a code rate higher than a mother code rate by puncturing a portion of the parity bits PB using the puncturing unit 300, the code output from the encoding device 100 can be accurately decoded and error-corrected.

The parity-bit generator polynomial may be verified by inputting '1 0 0 0 . . .' as the information bits IB. Before the first information bit IB is input, the first memory element 211a and the second memory element 212a may be initialized to store '0'. If '1' is input as the first information bit IB, the first operation unit 230a outputs a bit '1' by performing an XOR operation on the first information bit '1' and the output bit '0' of the second memory element 212a. The second operation unit 250a outputs a bit '1' by performing an XOR operation on the output bit '1' of the first operation unit 230a, the output bit '0' of the first memory element 211a and the output bit '0' of the second memory element 212a. That is, the encoder 200a may output '1' as the first parity bit PB. The first parity bit PB '1' corresponds to the first term '1' of the parity-bit generator polynomial. The first memory element 211a receives the output bit '1' of the first operation unit 230a, and the second memory element 212a receives the output bit '0' of the first memory element 211a.

When the second information bit IB is input after 1 unit time, the first memory element 211a and the second memory element 212a output '1' and '0', respectively. If '0' is input as the second information bit IB, the first operation unit 230a outputs a bit '0' by performing an XOR operation on the second information bit IB '0' and the output bit '0' of the second memory element 212a. The second operation unit 250a outputs a bit '1' by performing an XOR operation on the output bit '1' of the first operation unit 230a, the output bit '1' of the first memory element 211a and the output bit '0' of the second memory element. That is, the encoder 200a outputs '1' as the second parity bit PB. The second parity bit PB '1' corresponds to the second term 'D' of the parity-bit generator polynomial. The first memory element 211*a* receives the output bit '0' of the first operation unit 230*a*, and the second memory element 212*a* receives the output bit '1' of the first memory element 211*a*.

When the third information bit IB is input, the first memory element 211*a* and the second memory element 212*a* output '0' and '1', respectively. If '0' is input as the third information bit IB, the first operation unit 230*a* outputs a bit '1' by performing an XOR operation on the third information bit IB '0' and the output bit '1' of the second memory element 212*a*. The second operation unit 250*a* outputs a bit '0' by performing an XOR operation on the output bit '1' of the first operation unit 230*a*, the output bit '0' of the first memory element 211*a* and the output bit '1' of the second memory element. That is, the encoder 200*a* outputs '0' as the third parity bit PB. The third parity bit PB '0' corresponds to that a coefficient of 'D^2' is 0 in the parity-bit generator polynomial. The first memory element 211*a* receives the output bit '1' of the first operation unit 230*a*. The second memory element 212*a* receives the output bit '0' of the first memory element 211*a*.

When the fourth information bit IB is input, the first memory element 211*a* and the second memory element 212*a* output '1' and '0', respectively, which are the same as when the second information bit IB is input. That is, when the fourth information bit IB is input, the state of the memory unit 210*a* and the value of the currently input information bit IB are the same as when the second information bit IB is input. Thus, if the fourth information bit IB is input, the encoder 200*a* outputs '1' as the fourth parity bit PB, which is the same value as the second parity bit PB. Further, when the fifth information bit IB is input, the state of the memory unit 210*a* and the value of the currently input information bit IB are the same as when the third information bit IB is input. Thus, the encoder 200*a* may repeatedly output the parity bits PB of '1' and '0' with a period of 2 units of time from when the second information bit IB is input. Accordingly, it is verified that the parity-bit generator polynomial of the encoder 200*a* has coefficients of '110101010 . . . '.

The encoder 200*a* may output the information bits IB and the parity bits PB as an output code. Although it is illustrated in FIG. 4A that the encoder 200*a* has a code rate of 1/2, the encoder 200*a* may have various code rates according to embodiments. For example, the encoder 200*a* may have a code rate of 2/3, or any code rate.

Figure 4B:
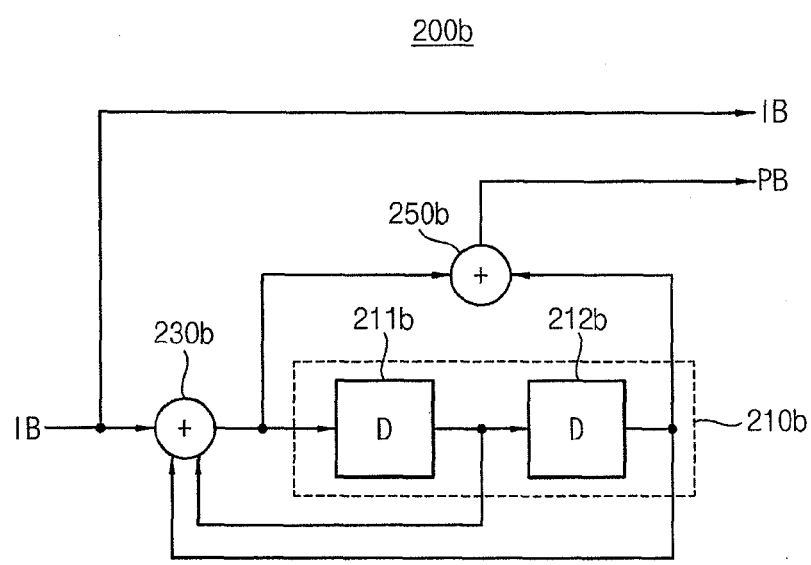

FIG. 4B illustrates an RSC encoder 200*b* having a memory order of 2 and a generator polynomial, G=[1, 5/7]. Referring to FIG. 4B, the encoder 200*b* may include a memory unit 210*b*, a first operation unit 230*b* and a second operation unit 250*b*.

The memory unit 210*b* may include a first memory element 211*b* and a second memory element 212*b*. The first memory element 211*b* may temporarily store a feedback bit output from the first operation unit 230*b*, and the second memory element 212*b* may temporarily store an output bit of the first memory element 211*b*. The first operation unit 230*b* may perform an XOR operation on a currently input information bit IB, the output bit of the first memory element 211*b* and an output bit of the second memory element 212*b*. The second operation unit 250*b* may perform an XOR operation on the output bit of the first operation unit 230*b* and an output bit of the second memory element 212*b*.

The encoder 200*b* has a parity-bit generator polynomial as follows: $P(D)=1+D+D^2+D^4+D^5+D^8+D^{10}+D^{11}\ldots$ .

The encoder 200*b* may repeatedly output the parity bits PB of '1', '1' and '0' with a period of 3 units of time from when the second information bit IB is input. That is, the parity-bit generator polynomial of the encoder 200*b* may have coefficients of '1110110110 . . . '.

Since a currently-output parity bit PB is affected by previously-input information bits IB as well as the currently input information bit IB, in embodiments of the encoding device 100 of FIG. 1 including the encoder 200*b* may have a high code rate, and may generate a code capable of error correction.

Figure 4C:
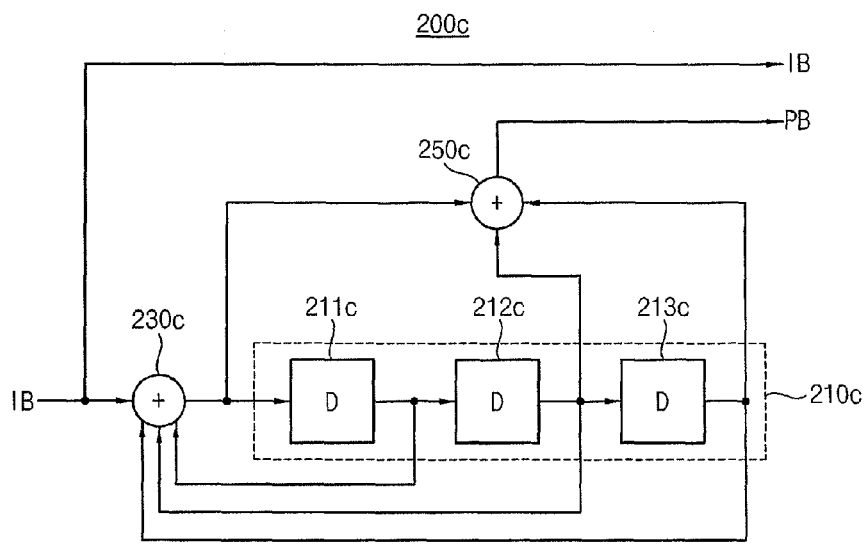

FIG. 4C illustrates an RSC encoder 200*c* having a memory order of 3 and a generator polynomial, G=[1, 15/17]. Referring to FIG. 4C, the encoder 200*c* may include a memory unit 210*c*, a first operation unit 230*c* and a second operation unit 250*c*.

The memory unit 210*c* may include a first memory element 211*c*, a second memory element 212*c* and a third memory element 213*c*. The first memory element 211*c* may temporarily store a feedback bit output from the first operation unit 230*c*. The second memory element 212*c* may temporarily store an output bit of the first memory element 211*c*. The third memory element 213*c* may temporarily store an output bit of the second memory element 212*c*. The first operation unit 230*c* may perform an XOR operation on a currently input information bit IB, the output bit of the first memory element 211*c*, the output bit of the second memory element 212*c* and an output bit of the third memory element 213*c*. The second operation unit 250*c* may perform an XOR operation on the output bit of the first operation unit 230*c*, the output bit of the second memory element 212*c* and the output bit of the third memory element 213*c*.

The encoder 200*c* may have a parity-bit generator polynomial as follows: $P(D)=1+D+D^2+D^5+D^6+D^9+D^{10}+D^{13}+D^{14}\ldots$ .

The encoder 200*c* may repeatedly output the parity bits PB with a period of 4 units of time. Since a currently-output parity bit PB is affected by previously-input information bits IB as well as the currently input information bit IB, in embodiments of the encoding device 100 of FIG. 1 including the encoder 200*c* may have a high code rate, and may generate a code capable of error correction.

Figure 4D:
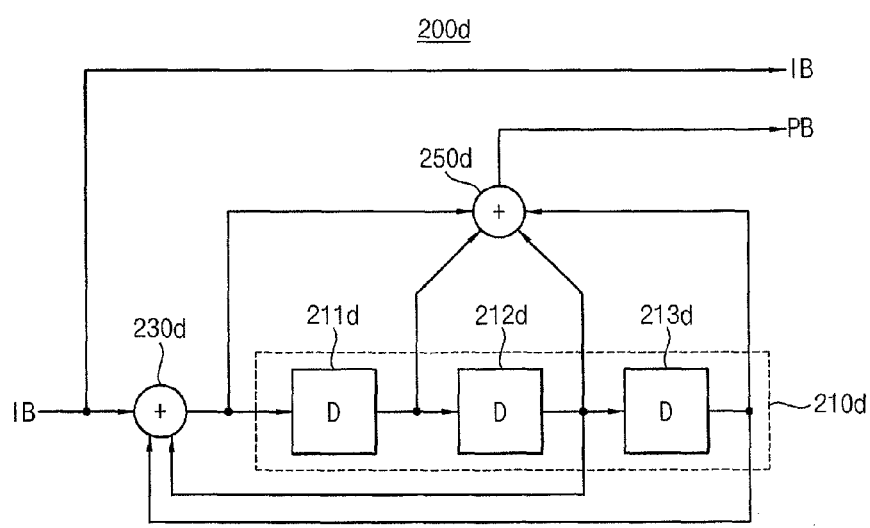

FIG. 4D illustrates an RSC encoder 200*d* having a memory order of 3 and a generator polynomial, G=[1, 17/15]. Referring to FIG. 4D, the encoder 200*d* may include a memory unit 210*d*, a first operation unit 230*d* and a second operation unit 250*d*.

The memory unit 210*d* may include a first memory element 211*d*, a second memory element 212*d* and a third memory element 213*d*. The first memory element 211*d* may temporarily store a feedback bit output from the first operation unit 230*d*. The second memory element 212*d* may temporarily store an output bit of the first memory element 211*d*. The third memory element 213*d* may temporarily store an output bit of the second memory element 212*d*. The first operation unit 230*d* may perform an XOR operation on a currently input information bit IB, the output bit of the second memory element 212*d* and an output bit of the third memory element 213*d*. The second operation unit 250*d* may perform an XOR operation on the output bit of the first operation unit 230*d*, the output bit of the first memory element 211*d*, the output bit of the second memory element 212*d* and the output bit of the third memory element 213*d*.

The encoder 200*d* has a parity-bit generator polynomial as follows: $P(D)=1+D+D^3+D^4+D^5+D^8+D^{10}+D^{11}+D^{12}+D^{15}\ldots$ .

The encoder 200*d* may repeatedly output the parity bits PB with a period of 7 unit time. Since a currently-output parity bit PB is affected by previously-input information bits IB as well as the currently input information bit IB, in embodiments of the encoding device 100 of FIG. 1 including the encoder 200d may have a high code rate, and may generate a code capable of error correction.

Figure 4E:
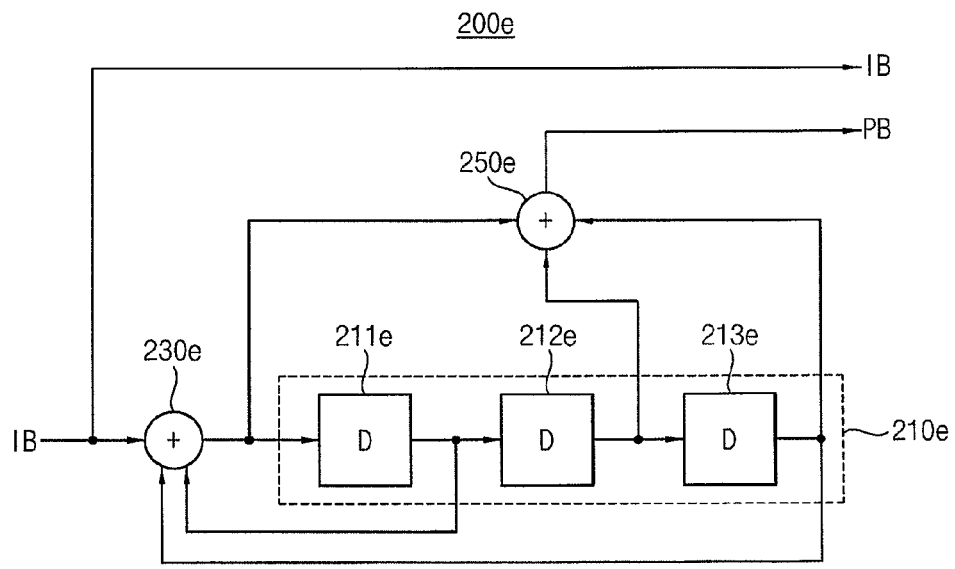

FIG. 4E illustrates an RSC encoder 200e having a memory order of 3 and a generator polynomial, G=[1, 15/13]. Referring to FIG. 4E, the encoder 200e may include a memory unit 210e, a first operation unit 230e and a second operation unit 250e.

The memory unit 210e may include a first memory element 211e, a second memory element 212e and a third memory element 213e. The first memory element 211e may temporarily store a feedback bit output from the first operation unit 230e. The second memory element 212e may temporarily store an output bit of the first memory element 211e. The third memory element 213e may temporarily store an output bit of the second memory element 212e. The first operation unit 230e may perform an XOR operation on a currently input information bit IB, the output bit of the first memory element 211e and an output bit of the third memory element 213e. The second operation unit 250e may perform an XOR operation on the output bit of the first operation unit 230e, the output bit of the second memory element 212e and the output bit of the third memory element 213e.

The encoder 200e has a parity-bit generator polynomial as follows: $P(D)=1+D+D^4+D^5+D^6+D^8+D^{11}+D^{12}+D^{13}\ldots$.

The encoder 200e may repeatedly output the parity bits PB with a period of 7 unit time. Since a currently-output parity bit PB is affected by previously-input information bits IB as well as the currently input information bit IB, in embodiments of the encoding device 100 of FIG. 1 including the encoder 200e may have a high code rate, and may generate a code capable of error correction.

Figure 4F:
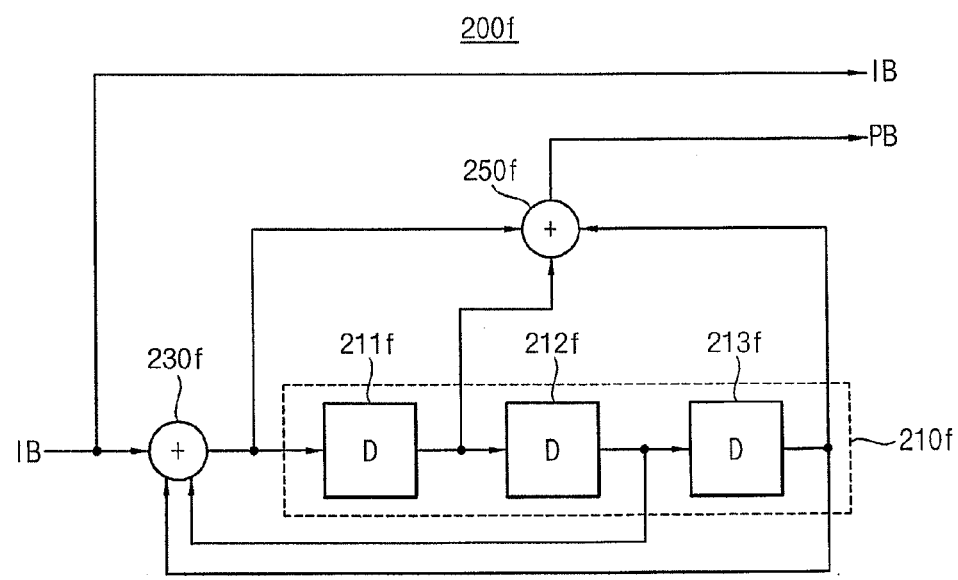

FIG. 4F illustrates an RSC encoder 200f having a memory order of 3 and a generator polynomial, G=[1, 13/15].

Referring to FIG. 4F, the encoder 200f includes a memory unit 210f, a first operation unit 230f and a second operation unit 250f.

The memory unit 210f includes a first memory element 211f, a second memory element 212f and a third memory element 213f. The first memory element 211f may temporarily store a feedback bit output from the first operation unit 230f, the second memory element 212f may temporarily store an output bit of the first memory element 211f, and the third memory element 213f may temporarily store an output bit of the second memory element 212f. The first operation unit 230f may perform an XOR operation on a currently input information bit IB, the output bit of the second memory element 212f and an output bit of the third memory element 213f. The second operation unit 250f may perform an XOR operation on the output bit of the first operation unit 230f, the output bit of the first memory element 211f and the output bit of the third memory element 213f.

The encoder 200f has a parity-bit generator polynomial as follows: $P(D)=1+D+D^2+D^3+D^6+D^8+D^9+D^{10}+D^{13}+D^{15}\ldots$.

The encoder 200f may repeatedly output the parity bits PB with a period of 7 unit time. Since a currently-output parity bit PB is affected by previously-input information bits IB as well as the currently input information bit IB, an encoding device 100 of FIG. 1 including the encoder 200f may have a high code rate, and may generate a code capable of error correction.

Figure 4G:
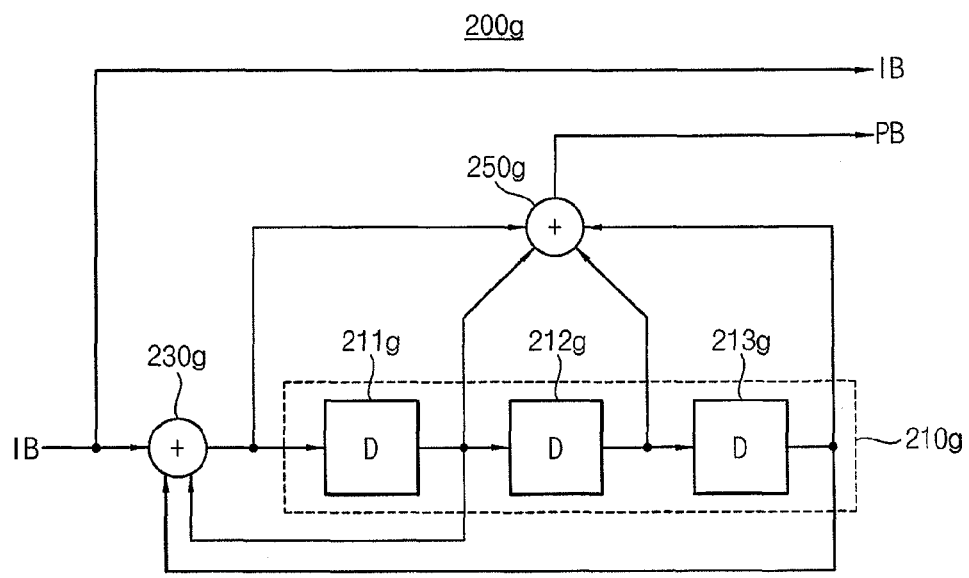

FIG. 4G illustrates an RSC encoder 200g having a memory order of 3 and a generator polynomial, G=[1, 17/13].

Referring to FIG. 4G, the encoder 200g includes a memory unit 210g, a first operation unit 230g and a second operation unit 250g.

The memory unit 210g includes a first memory element 211g, a second memory element 212g and a third memory element 213g. The first memory element 211g may temporarily store a feedback bit output from the first operation unit 230g, the second memory element 212g may temporarily store an output bit of the first memory element 211g, and the third memory element 213g may temporarily store an output bit of the second memory element 212g. The first operation unit 230g may perform an XOR operation on a currently input information bit IB, the output bit of the first memory element 211g and an output bit of the third memory element 213g. The second operation unit 250g may perform an XOR operation on the output bit of the first operation unit 230g, the output bit of the first memory element 211g, the output bit of the second memory element 212g and the output bit of the third memory element 213g.

The encoder 200g has a parity-bit generator polynomial as follows: $P(D)=1+D^2+D^3+D^4+D^6+D^9+D^{10}+D^{11}+D^{13}\ldots$.

The encoder 200g may repeatedly output the parity bits PB with a period of 7 unit time. Since a currently-output parity bit PB is affected by previously-input information bits IB as well as the currently input information bit IB, an encoding device 100 of FIG. 1 including the encoder 200g may have a high code rate, and may generate a code capable of error correction.

Figure 5:
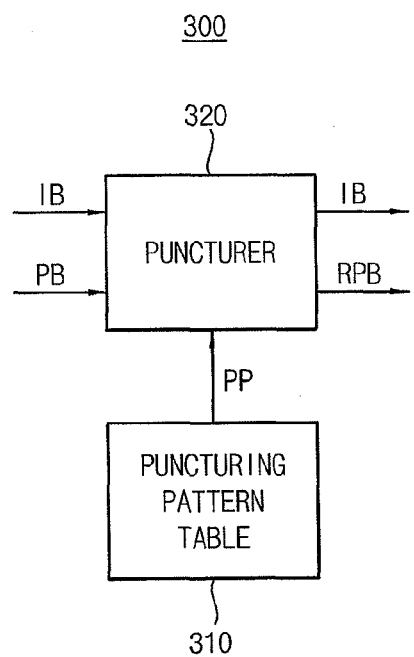
FIG. 5 illustrates a block diagram of an exemplary embodiment of a puncturing unit employable in the encoding device of FIG. 1.

FIG. 5 illustrates a block diagram of an exemplary embodiment of a puncturing unit 300 employable in the encoding device 100 of FIG. 1.

Referring to FIG. 5, the puncturing unit 300 may include a puncturing pattern table 310 and a puncturer 320.

The puncturing pattern table 310 may store a puncturing pattern PP. The puncturing pattern PP stored in the puncturing pattern table 310 may comply with a first criterion including determining a period of the puncturing pattern PP and a second criterion including determining positions of remaining parity bits RPB. The first criterion may determine the period of the puncturing pattern PP such that every information bit IB may participate in generating at least one remaining parity bit RPB. Accordingly, since the remaining parity bits RPB include information about every information bit IB, an error occurred at any information bit IB may be corrected using the remaining parity bits RPB.

The second criterion may determine the positions of the remaining parity bits such that the remaining parity bits RPB may be separated from each other. For example, the remaining parity bits RPB may have an interval of two bits or more. In some embodiments, the second criterion may determine the positions of the remaining parity bits such that the remaining parity bits RPB are uniformly and/or substantially uniformly distributed. Accordingly, since the remaining parity bits RPB may be generated uniformly and/or substantially uniformly in time, efficiency of error correction may be improved.

The period of the puncturing pattern PP may be determined based on a mother code rate of an encoder 200 included in an encoding device 100 of FIG. 1, a target code rate of the encoding device 100 and the first criterion. For example, if the mother code rate is 1/2 and the target code rate is 7/8, a ratio of the number of the remaining parity bits RPB to the period of the puncturing pattern PP is 1:7. First, it may be tested whether puncturing patterns PP having a period of 7 bits satisfies the first criterion. If the puncturing patterns PP having the period of 7 bits satisfy the first criterion, the puncturing patterns PP having the period of 7 bits may be used. Otherwise, the period of the puncturing pattern PP may be increased to satisfy the first criterion. For example, the puncturing patterns PP having a period of 14 bits, which include two remaining parity bits RPB, may be used. A puncturing pattern PP satisfying the second criterion may be selected from the puncturing patterns PP having the period of 14 bits. The selected puncturing pattern PP satisfying the first criterion and the second criterion may be stored in the puncturing pattern table 310.

The puncturer 320 may receive the information bits IB and parity bits PB from the encoder 200 illustrated in FIG. 1. The puncturer 320 may receive the puncturing pattern PP from the puncturing pattern table 310. The puncturer 320 may puncture the parity bits PB using the puncturing pattern PP, and may output the information bits IB and the remaining parity bits RPB as an output code of the encoding device 100 of FIG. 1. Accordingly, the output code generated by the encoding device 100 of FIG. 1 may have a high code rate. Further, since every information bit IB may participate in generating at least one remaining parity bit RPB and the remaining parity bits RPB are substantially uniformly distributed, an error occurred at the output code may be accurately corrected.

FIGS. 6A through 6E illustrate diagrams of exemplary puncturing patterns and remaining parity bits. In examples of FIGS. 6A through 6E, the encoder 200d of FIG. 4D is used as the encoder 200 of the encoding device 100 of illustrated in FIG. 1.

Figure 6A:
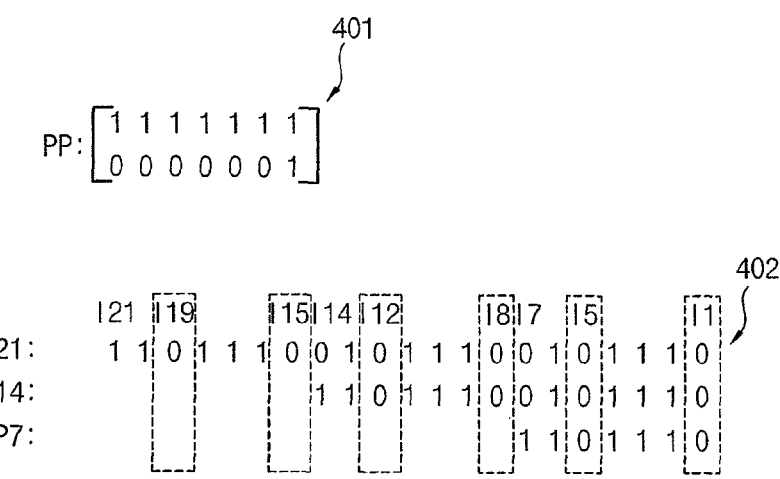

Referring to FIG. 6A, parity bits are punctured by a puncturing pattern 401 having a period of 7 bits, except the rightmost parity bit. For example, the seventh parity bit P7, the fourteenth parity bit P14, the twenty-first parity bit P21, etc., may not be punctured as remaining parity bits.

A matrix 402 may represent whether information bits participate in generating the remaining parity bit P7, P14 and P21. That is, the matrix 402 may represent whether the remaining parity bit P7, P14 and P21 include information about the information bits. For example, the seventh parity bit P7 generated when the seventh information bit I7 is input includes information about the second, third, fourth, sixth and seventh information bits, and does not include information about the first and fifth information bits. The fourteenth parity bit P14 generated when the fourteenth information bit I14 is input includes information about the second, third, fourth, sixth, ninth, tenth, eleventh, thirteenth and fourteenth information bits. The twenty-first parity bit P21 generated when the twenty-first information bit I21 is input includes information about the second, third, fourth, sixth, ninth, tenth, eleventh, thirteenth, sixteenth, seventeenth, eighteenth, twentieth and twenty-first infoimation bits.

The first information bit I1, the fifth information bit I5, the eighth information bit I8, the twelfth information bit I12, the fifteenth information bit I15, and the nineteenth information bit I19 do not participate in generating any one of the remaining parity bits P7, P14 and P21. That is, in a case where a puncturing unit 300 illustrated in FIG. 1 punctures the parity bits using the puncturing pattern 401, some information bits do not participate in generating the remaining parity bits. Accordingly, since the puncturing pattern 401 does not comply with the first criterion, an encoding device 100 of FIG. 1 may not employ the puncturing pattern 401. Since the puncturing pattern 401 having a period of 7 bits does not satisfy the first criterion, the period of the puncturing pattern may be increased.

Figure 6B:
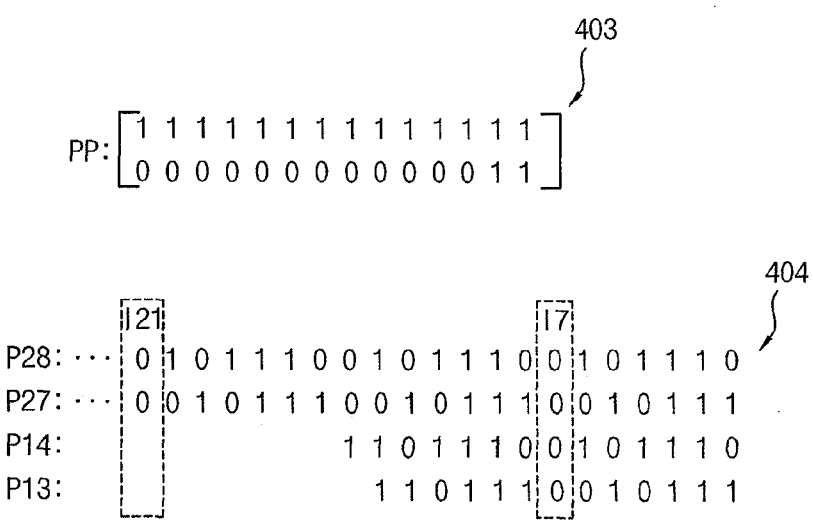

Referring to FIG. 6B, parity bits are punctured by a puncturing pattern 403 having a period of 14 bits, except two rightmost parity bits. As illustrated in a matrix 404, remaining parity bits P13, P14, P27 and P28 do not include information about the seventh information bit I7 and the twenty-first information bit I21. Accordingly, since the puncturing pattern 403 does not comply with the first criterion, an encoding device 100 of FIG. 1 may not employ the puncturing pattern 403. Since the puncturing pattern 403 having a period of 14 bits does not satisfy the first criterion, the period of the puncturing pattern may be increased.

Figure 6C:
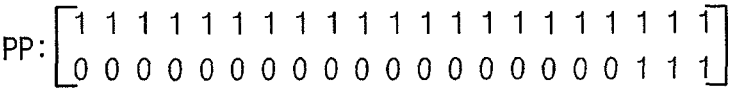

Referring to FIG. 6C, parity bits are punctured by a puncturing pattern 405 having a period of 21 bits, except three rightmost parity bits. As illustrated in a matrix 406, every information bit participates in generating at least one remaining parity bit P19, P20 and P21. That is, the puncturing pattern 405 complies with the first criterion. An interval between the nineteenth parity bit P19 and the twentieth parity bit P20 is one bit, and an interval between the twentieth parity bit P20 and the twenty-first parity bit P21 is one bit. That is, the remaining parity bits P19, P20 and P21 are not separated from each other. Accordingly, since the puncturing pattern 405 does not comply with the second criterion, an encoding device 100 of FIG. 1 may not employ the puncturing pattern 405. Since the puncturing pattern 405 does not satisfy the second criterion, a puncturing pattern satisfying the second criterion may be searched among puncturing patterns having the period of 21 bits.

Figure 6D:
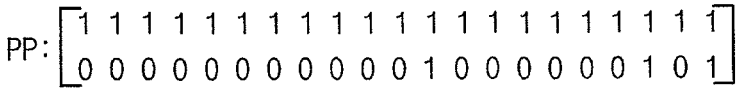

Referring to FIG. 6D, parity bits are punctured by a puncturing pattern 407 having a period of 21 bits except the thirteenth, nineteenth and twenty-first parity bits P13, P19 and P21. As illustrated in a matrix 408, every information bit participates in generating at least one remaining parity bit P13, P19 and P21. That is, the puncturing pattern 407 complies with the first criterion. Further, since the remaining parity bits P13, P19 and P21 are separated from each other, the puncturing pattern 407 complies with the second criterion. Accordingly, an encoding device 100 of FIG. 1 may employ the puncturing pattern 407. However, in the puncturing pattern 407, the remaining parity bits P13, P19 and P21 are not substantially uniformly distributed.

Referring to FIG. 6E, parity bits are punctured by a puncturing pattern 409 having a period of 21 bits except the thirteenth, seventeenth and twenty-first parity bits P13, P17 and P21. As illustrated in a matrix 410, every information bit participates in generating at least one remaining parity bit P13, P17 and P21. That is, the puncturing pattern 409 complies with the first criterion. Further, since the remaining parity bits P13, P17 and P21 are separated from each other, the puncturing pattern 409 complies with the second criterion. Accordingly, an encoding device 100 of FIG. 1 may employ the puncturing pattern 407. Further, since the remaining parity bits P13, P17 and P21 are substantially uniformly distributed, efficiency of error correction may be improved.

Figure 7:
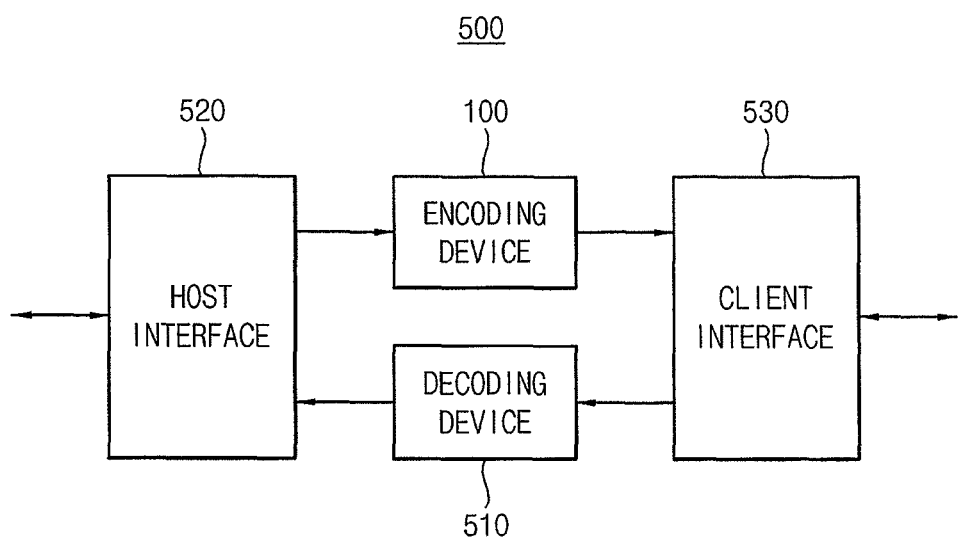
FIG. 7 illustrates a block diagram of an exemplary embodiment of a controller including the encoding device of FIG. 1.

FIG. 7 illustrates a block diagram of an exemplary embodiment of a controller 500 including the encoding device 100 of FIG. 1. Referring to FIG. 7, the controller 500 may include an encoding device 100 and a decoding device 510. The controller 500 may further include a host interface 520 and a client interface 530.

The encoding device 100 may receive information bits from a host device (now shown) through the host interface 520. The encoding device 100 may generate parity bits based on the information bits. The encoding device 100 may puncture the parity bits using a puncturing pattern complying with a first criterion and a second criterion. The encoding device 100 may provide at least one storage device (not shown) with a code including the information bits and remaining parity bits through the client interface 530.

The decoding device 510 may receive the code from the storage device through the client interface 530. The decoding device 510 may correct an error of the information bits using the remaining parity bits. The decoding device 510 may provide the host device with the error-corrected information bits through the host interface 520.

The controller 500 may be implemented as a separate device, or may be integrated into the host device or the storage device. The controller 500 may further include a puncturing pattern table for storing the puncturing pattern. In some embodiments, the puncturing pattern table may be included in the encoding device 100 or the decoding device 510. In other embodiments, the puncturing pattern table may be located outside the encoding device 100 and the decoding device 510.

Figure 8:
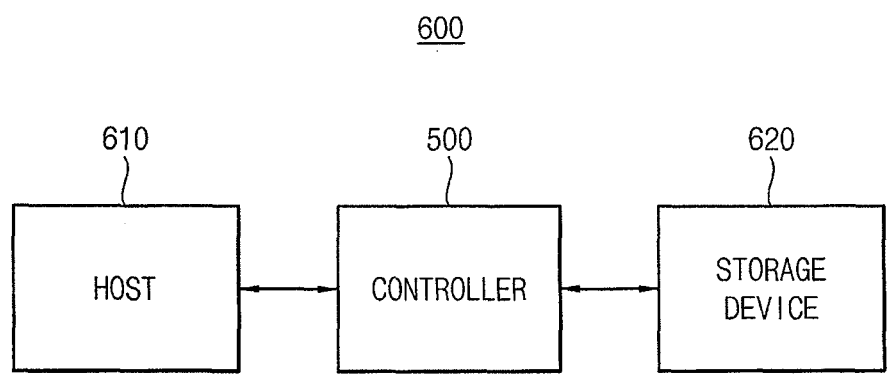
FIG. 8 illustrates a block diagram of an exemplary embodiment of a system including the controller of FIG. 7.

FIG. 8 is a block diagram illustrating a system 600 including the controller 500 of FIG. 7 according to some example embodiments. Referring to FIG. 8, the system 600 may include the controller 500, a host device 610 and at least one storage device 620.

The host device 610 may provide information bits to the controller 500. The controller 500 may provide the storage device 620 with a code by encoding the information bits. The controller 500 may read the code from the storage device 620, and may correct an error of the information bits by decoding the code. The controller may provide the storage device 620 with the error-corrected information bits.

In some embodiments, the storage device 620 may include a flash memory device. For example, the storage device 620 may include a NAND flash memory device of a single level cell (SLC) type or a multi level cell (MLC) type.

In some embodiments, the controller 500 may be a memory controller. The controller 500 may include a host interface that interacts with the host device 610 using a protocol, such as USB, SATA, and a client interface that interacts with the storage device 620 using a NAND interface protocol.

Embodiments employing one or more features described above may provide an encoding device having a relatively higher code rate relative to comparable conventional devices. Embodiments employing one or more features described herein may be configured to accurately correct the error of the information bits. Embodiments of an encoding device employing one or more features described herein may generate a code having a relatively high code rate and being capable of accurately correcting the error of the information bits.

Embodiments of an encoding device, a controller and/or a system employing one or more features described herein may generate a code having a high code rate by using a puncturing pattern complying with a first criterion and a second criterion. Further, embodiments of an encoding device, a controller and/or a system according employing one or more features described herein may efficiently correct an error by using the puncturing pattern complying with the first criterion and the second criterion.

The foregoing is illustrative of exemplary embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An encoding device, comprising:
an encoder configured to generate parity bits based on information bits; and
puncturing logic configured to puncture the parity bits based on a puncturing pattern complying with a first criterion and a second criterion, the first criterion determining a period of the puncturing pattern, and the second criterion determining positions of remaining parity bits, wherein:
the period of the puncturing pattern determined by the first criterion is based on a maximum number of consecutive coefficients of a parity bit generator polynomial of the encoder having a predetermined value, or
the positions of the remaining parity bits determined by the second criterion are spaced based on a period of the parity bit generator polynomial of the encoder.

2. The encoding device as claimed in claim 1, wherein the first criterion determines the period of the puncturing pattern such that each of the information bits participates in generating at least one of the remaining parity bits.

3. The encoding device as claimed in claim 1, wherein the second criterion determines the positions of the remaining parity bits such that the remaining parity bits are separated from each other based on the period of the parity bit generator polynomial of the encoder.

4. The encoding device as claimed in claim 1, wherein the second criterion determines the positions of the remaining parity bits such that the remaining parity bits are substantially uniformly distributed based on the period of the parity bit generator polynomial of the encoder.

5. The encoding device as claimed in claim 1, wherein the puncturing logic includes:
a puncturing pattern table configured to store the puncturing pattern; and
a puncturer configured to puncture the parity bits based on the puncturing pattern stored in the puncturing pattern table.

6. The encoding device as claimed in claim 1, wherein:
the period of the puncturing pattern determined by the first criterion is based on a maximum number of consecutive coefficients of a parity bit generator polynomial of the encoder having a predetermined value, and
the positions of the remaining parity bits determined by the second criterion are spaced based on a period of the parity bit generator polynomial of the encoder.

7. The encoding device as claimed in claim 1, wherein the period of the puncturing pattern is based on the following equation:

$$P = n*(k+1),$$

where P represents the period of the puncturing pattern, k represents the maximum number of consecutive coefficients of a parity bit generator polynomial of the encoder having the predetermined value, and n is an integer more than 1.

8. An encoding device, comprising:
an encoder configured to generate parity bits based on information bits; and
puncturing logic configured to puncture the parity bits based on a puncturing pattern complying with a first criterion and a second criterion, the first criterion determining a period of the puncturing pattern and the second criterion determining positions of remaining parity bits, wherein the period of the puncturing pattern is determined by the following equation:

$$P=n*(k+1),$$

where P represents the period of the puncturing pattern, k represents a maximum number of consecutive coefficients of a parity bit generator polynomial of the encoder having a value of 0, a mother code rate is 1/2, a target code rate is n/(n+1), and n is an integer more than 1.

9. The encoding device as claimed in claim 8, wherein, in a case where an equation (n*k+n)/3<p*k+k+1<=n*(k+1) is satisfied, the remaining parity bits are separated from each other by p+1 bits, where p is a period of a parity bit generator polynomial of the encoder.

10. The encoding device as claimed in claim 8, wherein, in a case where an equation p*k+k+1<(n*k+n)/A is satisfied, the remaining parity bits are separated from each other by A*p+1 bits, where p is a period of a parity bit generator polynomial of the encoder, and A is an integer more than 2.

11. The encoding device as claimed in claim 8, wherein, in a case where an equation p*k+k+1<(n*k+n)/A is satisfied, a location of an i-th remaining parity bit is determined by an equation (i'−1)*p+i, where p is a period of a parity bit generator polynomial of the encoder, A is an integer more than 2, and i' is determined by performing an i' determination operation i−1 times, and wherein the i' determination operation resets i' to 1 when an equation p*i'+i+1>n*k+n is satisfied, and increases i' by 1 when the equation p*i'+i+1>n*k+n is not satisfied.

12. An encoding device, comprising:
an encoder configured to generate parity bits based on information bits; and
puncturing logic configured to puncture the parity bits based on a puncturing pattern complying with a first criterion and a second criterion, the first criterion determining a period of the puncturing pattern, and the second criterion determining positions of remaining parity bits, wherein the encoder includes a recursive systematic convolutional encoder.

13. The encoding device as claimed in claim 12, wherein the recursive systematic convolutional encoder includes:
a memory configured to temporarily store feedback bits;
a first operator configured to perform a first operation on at least one first bit of the feedback bits stored in the memory and a currently input information bit of the information bits, and configured to provide a result of the first operation as the feedback bits to the memory; and
a second operator configured to perform a second operation on at least one second bit of the feedback bits stored in the memory unit and the result of the first operation, and configured to output a result of the second operation as the parity bits.

14. The encoding device as claimed in claim 13, wherein the memory includes:
a plurality of flip-flops connected in series,
the plurality of flip-flops configured to sequentially receive the feedback bits, and configured to perform a shift operation on the sequentially received feedback bits.

15. The encoding device as claimed in claim 13, wherein the first operator includes:
XOR logic configured to perform an XOR operation on the first bit and the currently input information bit.

16. The encoding device as claimed in claim 13, wherein the second operator includes:
XOR logic configured to perform an XOR operation on the second bit and the result of the first operation.

17. The encoding device as claimed in claim 12, wherein a mother code rate of the recursive systematic convolutional encoder is 1/2 or 2/3.

18. A controller, comprising:
an encoder configured to generate parity bits based on information bits provided from a host device, configured to puncture the parity bits based on a puncturing pattern complying with a first criterion and a second criterion, and configured to provide the information bits and remaining parity bits to at least one storage device, the first criterion determining a period of the puncturing pattern, and the second criterion determining positions of the remaining parity bits;
a decoder configured to correct an error of the information bits by decoding the information bits and the remaining parity bits received from the at least one storage device;
a host interface configured to interface with the host device; and
a client interface configured to interface with the at least one storage device.

19. The controller as claimed in claim 18, further comprising:
a puncturing pattern table configured to store the puncturing pattern.

20. A system, comprising:
a host device configured to generate information bits;
a controller including an encoder configured to receive the information bits from the host device, configured to generate parity bits based on the information bits, and configured to generate a code including the information bits and remaining parity bits by puncturing the parity bits based on a puncturing pattern complying with a first criterion and a second criterion, the first criterion determining a period of the puncturing pattern, and the second criterion determining positions of the remaining parity bits; and
a storage device configured to store the code including the information bits and the remaining parity bits, wherein the storage device includes a flash memory device.

* * * * *